United States Patent [19]

Brady et al.

[11] 3,927,939

[45] Dec. 23, 1975

[54] APPARATUS FOR REDUCING ROTATION COMPONENTS IN TABLE TRANSLATION

[75] Inventors: Kevin James Brady, Murray Hill; Victor Andrew Firtion, Secaucus; Leif Rongved, Summit; Thomas Edward Saunders, Basking Ridge, all of N.J.

[73] Assignee: Bell Telephone Laboratories, Incorporated, Murray Hill, N.J.

[22] Filed: Dec. 27, 1973

[21] Appl. No.: 429,037

[52] U.S. Cl. .................................. 355/54; 354/124

[51] Int. Cl.$^{2}$ ........................................ G03B 27/44

[58] Field of Search ...... 355/54; 354/120, 123, 124; 353/27

[56] References Cited

UNITED STATES PATENTS

| | | | |
|---|---|---|---|
| 3,680,461 | 8/1972 | Amesbury | 354/124 |

*Primary Examiner*—John M. Horan
*Attorney, Agent, or Firm*—R. B. Anderson

[57] ABSTRACT

A table is reciprocated along a straight line by a force that does not precisely control movement direction. Accurate motion constraint is provided by two separated air bearings arranged along a common axis. A third air bearing, displaced from the common axis, supports the table on a sleeve that is free to rotate on its axis.

10 Claims, 7 Drawing Figures

FIG. 1
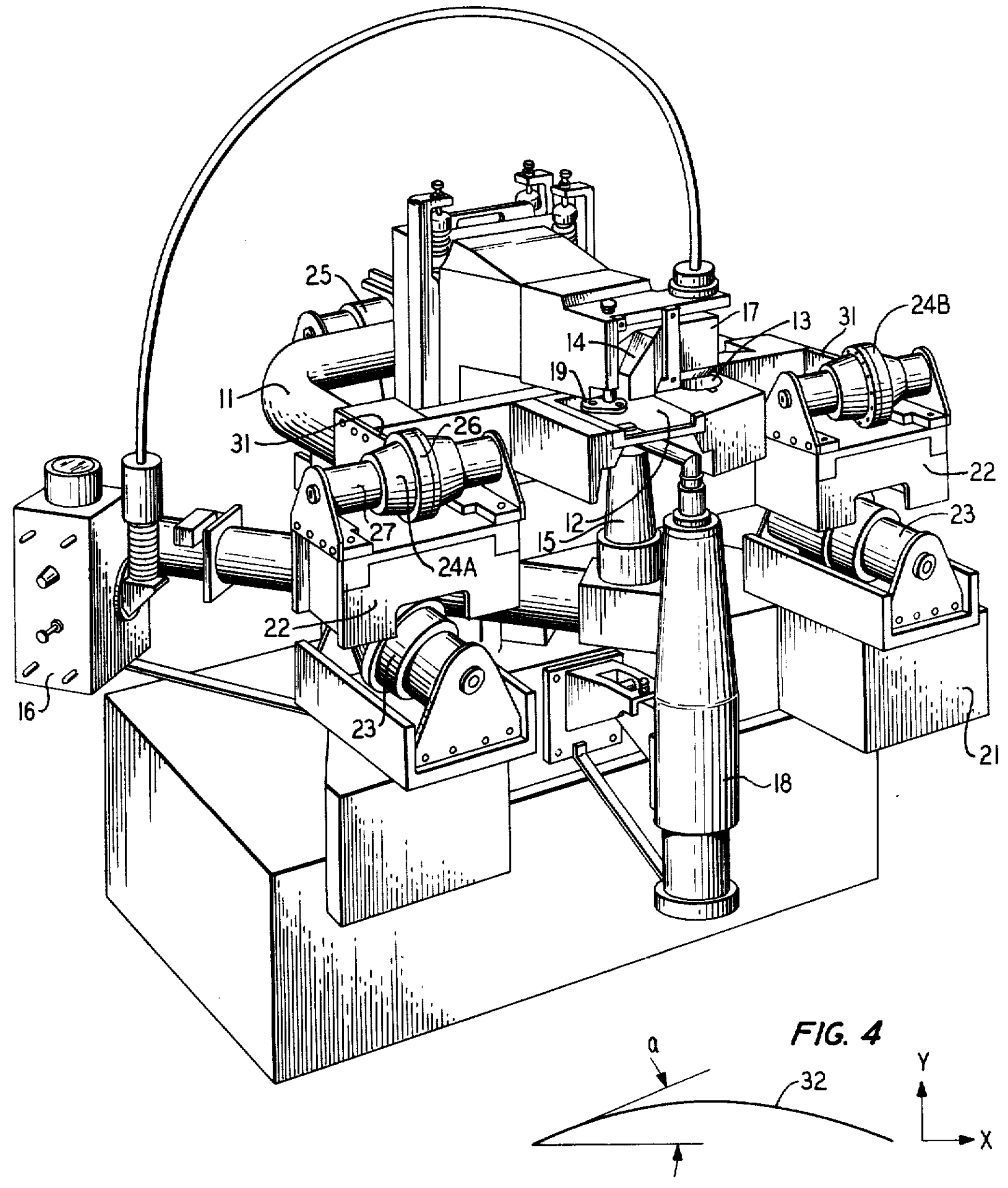
FIG. 4
FIG. 5
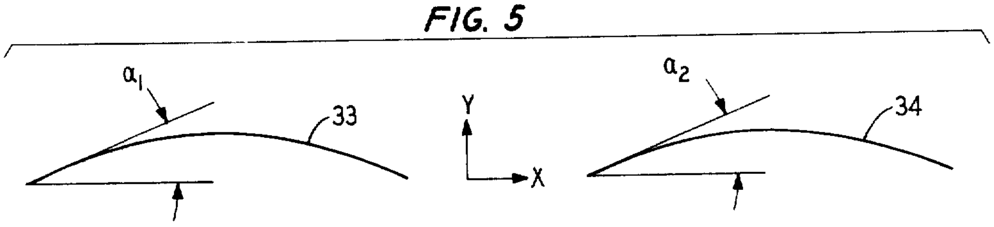

APPARATUS FOR REDUCING ROTATION COMPONENTS IN TABLE TRANSLATION

BACKGROUND OF THE INVENTION

This invention relates to apparatus for reducing rotation components in table translation and, more particularly, to techniques for aiding in accurate image projection as required in scanning projection printing.

The copending application of M. Feldman and M. C. King, Ser. No. 277,275, filed Aug. 2, 1972, now U.S. Pat. No. 3,819,265, issued June 25, 1974, and assigned to Bell Telephone Laboratories, Incorporated, describes a photolithographic printing technique particularly useful in the fabrication of semiconductor devices. A semiconductor wafer covered with a photosensitive film and a mask of the circuit to be made are mounted on a common movable translation table. Only a small portion of the mask is imaged on the film by a high-resolution, small image field optical system, as is required for printing accurately the detailed mask pattern. The translation table is then reciprocated in an $x$ direction and periodically stepped in a $y$ direction to give raster scanning of the sensitized wafer by the projected mask image. This permits printing of an entire mask pattern through the use of a lens system having an image field area much smaller than the area of the pattern to be printed, thereby giving higher resolution than could ordinarily be obtained.

As the table reciprocates back and forth, it is important that the relative positions of the mask and wafer be maintained with an accuracy corresponding to the fine dimensions of the pattern being printed. Any spurious rotations of the table will result in a misalignment of the wafer with respect to the mask, with consequent blurring of the printed image. To take best advantage of the optical capabilities of the Feldman et al. technique for printing detailed integrated circuit patterns, we have determined that table rotation about a vertical or $z$ axis should be maintained at less than $\pm$ 0.2 arc seconds.

The best mechanical apparatus presently available for insuring precise linear motion is an air bearing in which a movable element or sleeve surrounds an axial stationary element or stator and is separated from it and supported by a cushion of air. The sleeve and stator may be either cylindrical or rectangular in cross section, depending upon whether one wishes to permit angular movement of the sleeve about the central axis. In either case, a table mounted on the sleeve will move back and forth along the central axis with little friction and with more accuracy than that provided by any other known bearing. However, where the translation distance is on the order of inches, air bearings have been found to manifest a rotation component of about one arc second at best, which is insufficient for best operation of the scanning projection printing apparatus of the Feldman et al. application.

SUMMARY OF THE INVENTION

Accordingly, it is an object of this invention to reduce the rotational components accompanying table translation and table reciprocation.

It is another object of this invention to increase the accuracy with which mask patterns can be printed on a photosensitive medium.

These and other objects of the invention are obtained in an illustrative embodiment comprising a scanning projection printing table for supporting a photolithographic mask and wafer, the table being mounted on three air bearings for reciprocation in an $x$ direction. Movement accuracy is maintained by two steering air bearings arranged along parallel axes but separated by a distance in the $x$ direction. The two steering bearings control reciprocation in the $x$ direction, while the third bearing provides support, but not motion constraint. It can be shown that movement linearity is proportional to the separation in the $x$ direction of the two steering air bearings; that is, by increasing the separation of the two axially aligned bearings, one can reduce spurious rotational components of the table to achieve a much greater total linearity than that provided by either one of the bearings separately.

As will be explained more fully later, nonlinearity in an air bearing can be described by its tendency to travel in an arc having an angle $a$ and it is this unwanted curvature that gives rise to an unwanted rotational component in the table movement. It can be shown that by arranging the two steering air bearings such that an angle $a$ of both bearings extends in the same direction, the curvature of one will compensate for that of the other, giving a reduction or elimination of table rotational components. Even if no such compensation is made, a substantial reduction results from the separation distance, and it is a straightforward design matter to reduce angle deviation as required.

An inflexible fixed attachment of the air bearing sleeves to the table might give a binding action due to the slight motion curvature mentioned before. This problem is avoided by attaching the sleeves of the two steering air bearings to the table by flexible webs extending in a plane perpendicular to the table. The table may be biased against the support bearing by its own weight, or alternatively, may be spring biased against it. The support bearing preferably has a cylindrical sleeve which is free to rotate, thereby to avoid constraining the $x$-direction motion of the table, as will be explained more fully later.

These and other objects, features and advantages of the invention will be more fully understood by consideration of the following detailed description taken in conjunction with the accompanying drawing.

DRAWING DESCRIPTION

FIG. 1 is a perspective view of a scanning projection printer incorporating an illustrative embodiment of the invention;

FIGS. 4, 5, 6 and 7 are representations of various air bearing paths, presented for illustrating various principles of operation of the invention.

DETAILED DESCRIPTION

Figure 2:
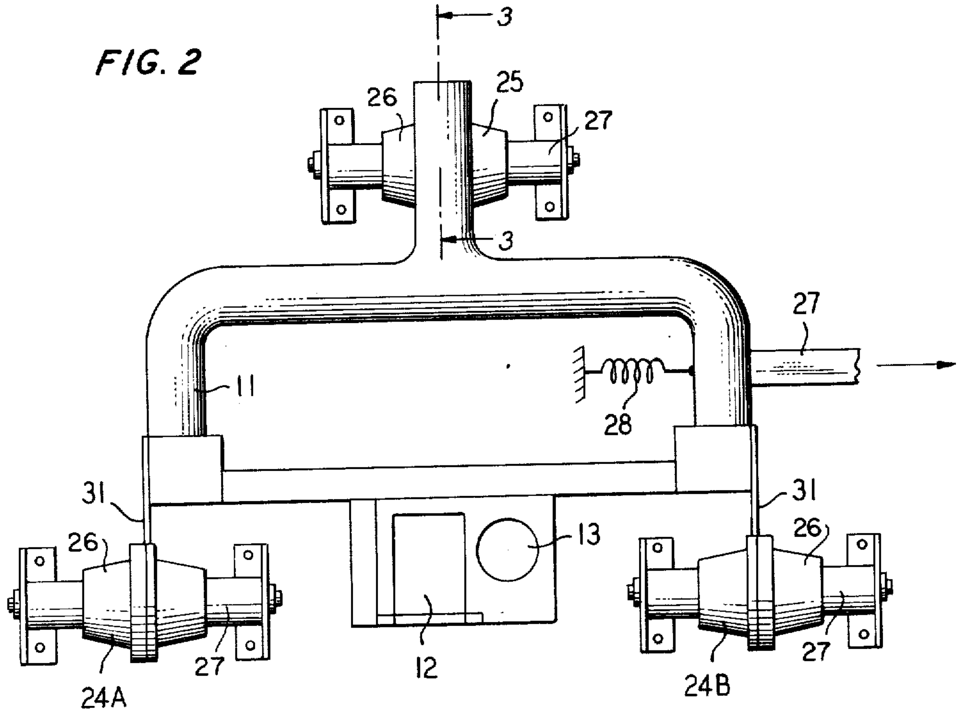
FIG. 2 is a top view of the support table and associated air bearings of the apparatus of FIG. 1.

Referring now to FIG. 1, there is shown a perspective view of a scanning projection printer of the type described in the aforementioned Feldman et al. application. A table 11 supports on an upper surface a photolithographic mask 12 and a semiconductor wafer 13. Light from a main illuminator 15 is projected through the mask 12 and reflected and imaged by optical apparatus 14 onto a photosensitive film covering the upper surface of wafer 13. The purpose of the apparatus is to permit the imaging of a mask pattern onto a sensitized wafer by a lens system having an extremely high resolution with a concomitant image field that is smaller than the area of the mask pattern. Imaging of the entire mask pattern area is accomplished by moving the table 11 in a raster scan fashion so that eventually all portions of the mask pattern are imaged on the wafer 13.

The light for the main illuminator is generated by a light source 16. An alignment illuminator 17 is used to illuminate the wafer 13 during the alignment of the mask. The mask alignment is done manually while observing superimposed images of the mask and the wafer through a movable alignment microscope 18. As described in the Feldman et al. application, alignment is made during wafer illumination with nonactinic light, exposure is made with actinic light, and a focus corrector plate 19 is used to compensate for the wavelength difference of the actinic and nonactinic light.

As mentioned before, the purpose of the scanning projection printer is to give photolithographic printing with greater precision than has heretofore been possible; its practical usefulness therefore requires a corresponding precision of all mechanical parts. The apparatus is preferably mounted on a base 21 of Invar so as to minimize differential thermal expansion. The table 11 is mounted on a step table 22 which is driven in a $y$ direction by a lead screw mounted in a ball bearing to prevent binding; the lead screw construction so as to give proper stepping motion in the $y$ direction is a matter within the ordinary skill of a worker in the art and has therefore not been shown in detail. Friction is minimized and motion made linear by mounting step table 22 on air bearings 23. The table 11 is reciprocated back and forth in an $x$ direction and is supported, in accordance with the invention, by two steering air bearings 24A and 24B and a support air bearing 25.

Figure 3:
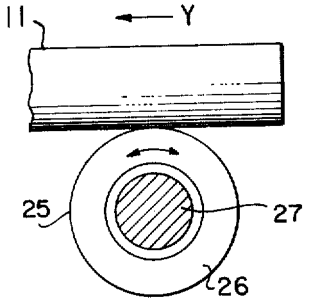
FIG. 3 is a sectional view of the support bearing of the apparatus of FIG. 1.

The arrangement of the air bearings on table 11 will be better understood from a consideration of FIG. 2 which is a top view of the table 11 and of bearings 24A, 24B and 25. The driving force on the table is applied by a flexible belt 27 which is held taut by a spring shown schematically as 28. The reason that the force is applied through a belt is to give a force in the $x$ direction which does not constrain table direction; rather, direction of movement is controlled by steering air bearings 24. As best shown in FIG. 3, which includes a sectional view of bearing 25, each air bearing comprises a hollow cylindrical sleeve 26 surrounding a central shaft or stator 27 and separated from it by cushion of air. As is known, the air bearing stator may be made of ceramic which is polished to give axial linearity within extremely close tolerances, while giving minimal friction due to support on the cushion of air.

Air bearings 24A and 24B are arranged along a common axis, but, to prevent binding due to minute deviations from linearity, they are fixed to the table by flexible webs 31. As can be appreciated in FIG. 1, webs 31 are located in the $y$-$z$ plane and preclude relative motion in the $y$ or $z$ directions, but are flexible enough to bend slightly in the $x$ direction. The bearing 25 is not fixed to the table and does not constrain the $x$-direction motion, but merely acts as a low friction support.

In spite of the high degree of linearity that characterizes air bearings, the slight deviations of the best air bearings are sufficiently great to reduce significantly the performance of a scanning projection printer. The deviation from linearity of a typical reciprocation can be characterized as a movement path 32 of FIG. 4 which deviates from true linearity by an angle $a$. If path 32 controlled the movement of the table, it can be seen that the wafer portion of the table would rotate slightly with respect to the mask portion during movement thereby disrupting the relative registration of the two to give blurring of the recorded image. With the present state of the optical art, including the use of high resolution, low distortion lenses, it can be shown that, to avoid degradation, table rotation about a vertical or $z$ axis should be maintained at less than ± 0.2 arc seconds. It can further be shown that the best commercially available air bearings have a sufficient deviation angle $a$ to give a rotation component of about 1 arc second. Thus, the purpose of the air bearing arrangement shown is to reduce the table rotation component to a figure smaller than that dictated by a single air bearing.

The efficacy of using two displaced steering air bearings to control table movement is illustrated in FIG. 5 in which path 33 can be considered the path of bearing 24A and path 34 that of bearing 24B. It can be appreciated that if the deviation angles $a_1$ and $a_2$ of the two paths are exactly equal and in the same direction as shown, rotation of the table will be eliminated. That is, as the table moves from left to right, the entire table will be displaced slightly upwardly and then slightly downwardly, but the displacement is equal and therefore there is no relative rotation of the table about a perpendicular $z$ axis. It should be noted that the direction of the angle $a$ of any bearing can be determined in a known manner through the use of an interferometer measurement, and therefore it is a simple matter to mount the bearings such that the angles $a$ extend in the same direction. Further, interferometer measurements can be used in aligning the two steering air bearings such that they lie on parallel axes; that is, successive measurements can be made after slight angular displacements of one bearing relative to the other until precise positioning is achieved.

Figure 6:
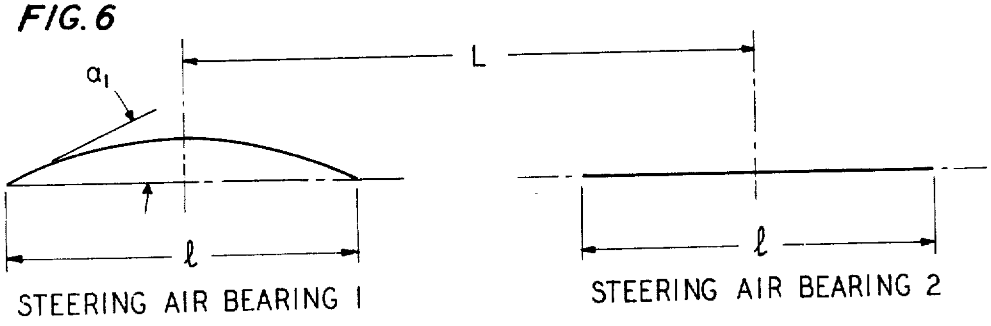

It can also be appreciated that, if angles $a_1$ and $a_2$ are different, there will be some table rotation, and as the difference increases such unwanted rotation increases. The "worst case" situation is depicted in FIG. 6 in which bearing 24A has a characteristic rotation $a_1$, but the bearing 24B reciprocates in a straight line and therefore cannot be mounted to provide compensatory displacement as described above. Consider the distance between the bearings to be L as shown and the distance through which the table is reciprocated to be $l$.

Figure 7:
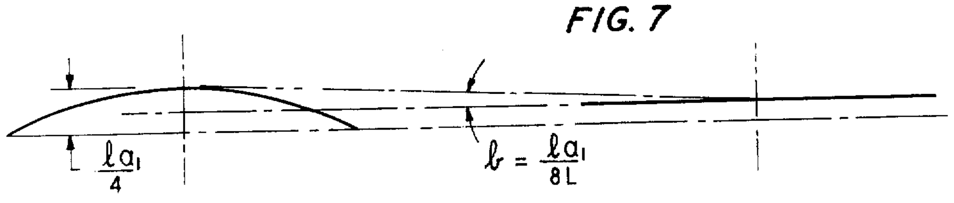

Referring to FIG. 7 it can be shown that the table does not rotate through an angle $a$; but rotates through an angle $b$ given by $$b = l a_1 / 8L. \quad (1)$$

It can be seen that if the distance L is at least as large as the distance $l$, table rotation will be reduced by a factor of 8. In the preferred embodiment, L is many times greater than $l$ to give even greater reduction; for example the reciprocation distance $l$ may be 4 inches, and the separation distance L between the steering bearings may be 28 inches. This gives a more than fifty-fold reduction in table rotation, which results in linear movement well within the prescribed tolerances described for optical performance. Measurements have shown spurious table rotation typically to be much less than 0.1 arc seconds and stable. In fact, the inherent rotation reduction has been found to be so pronounced that in most cases it is necessary to measure the angles $a$ of the various air bearings for mounting them in the optimum position, because adequate compensation inherently occurs.

The operation of our bearing arrangement requires that only two steering air bearings be used, and that they be mounted on a table with their central axes parallel but with a displacement L in the direction of reciprocation. As mentioned before, they are fixed to the table by flexible webs 31 which preclude relative motion in the *y* or *z* directions, but which are sufficiently flexible to prevent binding that might otherwise occur due to differences in the angles $a_1$ and $a_2$ or misalignment of the bearing axes. Specifically, the webs permit rotation of the sleeves around *y* and *z* axes.

Because of the axial separation L that is required, and the need for flexible attachments to the table, it is necessary to provide a third air bearing 25 for support. However, it is important that this bearing not constrain axial motion in the *x* direction, and accordingly, the table is preferably merely rested on the bearing 25 as illustrated in FIG. 3. That is, because the sleeve of bearing 25 is free to rotate about its central axis, the table 11 is free to move in the *y* direction as well as in the *x* direction. The weight of the table is normally sufficient to provide stability, but if so desired, a spring bias may be used to hold the table 11 against the bearing 25. It is of course important that the axes of the three bearings define a common plane to avoid rotation about the axis of reciprocation.

Because the steering air bearings should determine reciprocating motion, the driving force is preferably applied through a taut belt 27, as mentioned before. If the motion were provided by a piston or the like being inflexibly fixed to the table, it would undesirably interfere with the axial motion provided by the steering bearings.

The foregoing is to be considered merely illustrative of the inventive principles involved. Various other embodiments and modifications may be made by those skilled in the art without departing from the spirit and scope of the invention.

It has been noted that table rotation due to nonparallel positioning of the steering air bearings is precisely determinable, which suggests that precisely measured curvatures in the table movement could be designed, if so desired. This may be useful for compensating for slight relative rotations of the image and object due to optical deviations, describing precise curves, and for various other purposes.

What is claimed is:

1. Apparatus for driving a table in a reciprocating manner with minimal rotational components comprising:

means for applying a motion to the table in an *x* direction;

means for constraining table motion comprising first and second air bearings arranged along parallel axes which extend in the *x* direction;

the distance separating the first and second bearings being longer than the distance through which the table moves;

means for supporting the table and for preventing its rotation comprising a third air bearing having an axis extending substantially in the *x* direction.

2. The apparatus of claim 1 wherein:

the first and second air bearings are attached to the table by flexible joints, thereby to constrain table motion without binding; and the third air bearing is not attached to the table.

3. The apparatus of claim 2 wherein:

the third air bearing comprises a sleeve for supporting the table, the sleeve being free to rotate about its axis.

4. The apparatus of claim 3 wherein:

the table is located in an *x-y* plane;

the first and second air bearings are attached to the table by flexible webs located in a *y-z* plane perpendicular to the *x-y* plane.

5. In photolithographic projection apparatus of the type comprising a mask and a photosensitive medium mounted on a common support table, means for imaging a portion of the mask onto a portion of the photosensitive medium, and means for reciprocating the table in an *x* direction and stepping the table in a perpendicular *y* direction after each reciprocation to cause substantially all portions of the mask to be imaged on different portions of the photosensitive medium, the improvement comprising:

means for constraining table motion in the *x* direction comprising first and second air bearings each arranged along an axis extending in the *x* direction;

the distance in the *x* direction separating the first and second bearings being longer than the distance through which the table is reciprocated;

means for supporting the table and for preventing rotation comprising a third air bearing arranged along an axis extending in the *x* direction.

6. The improvement of claim 5 wherein:

a table is located in the *x-y* plane;

the first and second air bearings are attached to the table by flexible webs located in a *y-x* plane perpendicular to the *x-y* plane; and the third air bearing comprises a sleeve being adapted to rotate freely about a parallel axis, the table being supported by the third air bearing sleeve.

7. In apparatus for driving a support table in a straight line while maintaining one surface in a common plane, the improvement comprising:

means for mounting the table comprising first, second and third air bearings each comprising a shaft adapted to be supported by a cushion of air;

shafts of the first and second bearings being axially aligned, the third bearing being mounted between the first and second bearings but removed from the common axis;

any deviation from linearity of the shaft movement of the first bearing being predominantly in a first direction and any deviation from linearity of the shaft movement of the second bearing being predominantly in a second direction;

the first bearing being mounted with respect to the second bearing such that the first direction of deviation is substantially the same as the second direction of deviation.

8. The improvement of claim 7 wherein:

the first and second bearings are fixedly attached to the support table, thereby to constrain its motion, while the third bearing is not fixedly attached and thereby does not control motion along the straight line.

9. The improvement of claim 8 wherein:

the first and second bearings are connected by flexible metal webs to the support table.

10. The improvement of claim 9 wherein:

the first, second and third bearings are located at vertices of an equilateral triangle.

* * * * *